(12) United States Patent
Haller et al.

(10) Patent No.: US 7,998,813 B2
(45) Date of Patent: Aug. 16, 2011

(54) METHODS OF FABRICATING AN ACCESS TRANSISTOR HAVING A POLYSILICON-COMPRISING PLUG ON INDIVIDUAL OF OPPOSING SIDES OF GATE MATERIAL

(75) Inventors: Gordon A. Haller, Boise, ID (US); Sanh D. Tang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/960,862

(22) Filed: Dec. 6, 2010

(65) Prior Publication Data

US 2011/0081755 A1    Apr. 7, 2011

Related U.S. Application Data

(63) Continuation of application No. 11/521,329, filed on Sep. 13, 2006, now Pat. No. 7,858,471.

(51) Int. Cl.
*H01L 21/336* (2006.01)

(52) U.S. Cl. ......... 438/258; 438/197; 438/257; 438/259

(58) Field of Classification Search ............... 257/259, 257/314, 315, 317; 438/258, 197, 216, 241, 438/259, 275, 424
See application file for complete search history.

(56) References Cited

U.S. PATENT DOCUMENTS

| | | | |
|---|---|---|---|
| 5,918,123 A | 6/1999 | Yang | |
| 6,037,194 A | 3/2000 | Bronner et al. | |
| 6,258,667 B1 | 7/2001 | Huang | |
| 6,278,164 B1 | 8/2001 | Hieda et al. | |
| 6,387,717 B1 | 5/2002 | Blalock et al. | |
| 6,486,023 B1 | 11/2002 | Nagata | |
| 6,713,312 B2 | 3/2004 | Blalock et al. | |
| 6,717,210 B2 | 4/2004 | Takano et al. | |
| 6,737,323 B2 | 5/2004 | Mo | |
| 7,026,218 B2 | 4/2006 | Rotondaro et al. | |
| 7,056,781 B2 | 6/2006 | Yoon et al. | |
| 7,064,066 B1 | 6/2006 | Metz et al. | |
| 7,091,654 B2 | 8/2006 | Blalock et al. | |
| 7,183,164 B2 | 2/2007 | Haller | |
| 7,199,419 B2 | 4/2007 | Haller | |
| 7,223,679 B2 | 5/2007 | Murthy et al. | |
| 7,285,812 B2 | 10/2007 | Tang et al. | |
| 7,317,231 B2 | 1/2008 | Metz et al. | |
| 7,323,375 B2 | 1/2008 | Yoon et al. | |
| 7,329,581 B2 | 2/2008 | Kang et al. | |
| 7,368,344 B2 | 5/2008 | Haller | |
| 7,405,449 B2 | 7/2008 | Yagishita | |
| 7,416,943 B2 | 8/2008 | Figura et al. | |
| 7,425,497 B2 | 9/2008 | Chudzik et al. | |
| 7,521,322 B2 | 4/2009 | Tang et al. | |
| 7,557,032 B2 | 7/2009 | Nejad et al. | |
| 7,626,223 B2 | 12/2009 | Haller | |
| 7,687,342 B2 | 3/2010 | Haller et al. | |
| 7,696,567 B2 | 4/2010 | Haller et al. | |
| 2008/0061346 A1 | 3/2008 | Tang et al. | |

*Primary Examiner* — Thanh V Pham
*Assistant Examiner* — Errol Fernandes
(74) *Attorney, Agent, or Firm* — Wells St. John P.S.

(57) ABSTRACT

Fabrication methods for gate transistors in integrated circuit devices enable the formation of recessed access device structures or FinFET structures having P-type workfunctions. The fabrication methods also provide for the formation of access transistor gates of an access device following formation of the periphery transistor gates. Access devices and systems including same are also disclosed.

5 Claims, 8 Drawing Sheets

METHODS OF FABRICATING AN ACCESS TRANSISTOR HAVING A POLYSILICON-COMPRISING PLUG ON INDIVIDUAL OF OPPOSING SIDES OF GATE MATERIAL

BACKGROUND OF THE INVENTION

1. Field of the Invention

Embodiments of the invention relate to the formation of semiconductor circuitry and, more particularly, to the formation and fabrication of access devices for use in semiconductor devices.

2. State of the Art

The formation of access devices is well known and fabrication processes for creating such devices have been developed and perfected. However, as feature sizes in semiconductor devices decrease, new methods for fabricating access devices are being developed.

In many conventional access devices, such as in dynamic random access memory (DRAM) memory circuits, metal-oxide-semiconductor field-effect transistors (MOSFETs) or the like have been used to form the periphery transistor gates and access transistor gates of the devices. However, as the feature sizes of access devices are reduced, new, scalable, gate structures are desired.

Alternative gate structures that will be scalable over the next few years have been developed for use with access device technology. Two such structures include recessed access device (RAD) gate structures and fin-shaped field effect transistors, which are also known as FinFET gate structures. One advantage of the RAD structures and FinFET structures is that the fabrication processes used to form such structures are compatible with conventional MOSFET fabrication processes. Another advantage of using RAD structures and FinFET structures with access devices is that the RAD structures and FinFET structures are scalable to the smaller feature sizes quickly becoming integrated with current integrated circuit fabrication technologies.

In conventional access devices, the periphery transistors and access transistors are fabricated from MOSFET type gate transistors. The periphery transistors and access transistors are generally fabricated simultaneously and the doping of the transistor structures has been predominantly N-type doping. For example, the preferred doping patterns for access device transistors includes the formation of N+ doped polysilicon for access transistor gates, N+ doped polysilicon for periphery NMOS transistor gates, and N+ doped polysilicon for periphery PMOS transistor gates. In some instances, P+ doped polysilicon has been used for the periphery PMOS transistor gates.

While N-type doping is conventionally used to form access transistors, it would be beneficial to provide access gate transistors having P-type doping. In addition, the simultaneous formation and doping of gate transistors in access device fabrication is sufficient for the formation of N-type doped gate transistors, however, it is not ideal for the formation of access gate transistors having P-type doping. Therefore, it is desirable to develop fabrication methods for forming access transistors having a P-type doping or a P-type workfunction.

BRIEF DESCRIPTION OF THE DRAWINGS

While the specification concludes with claims particularly pointing out and distinctly claiming that which is regarded as the present invention, this invention can be more readily understood and appreciated by one of ordinary skill in the art from the following description of the invention when read in conjunction with the accompanying drawings in which:

DETAILED DESCRIPTION OF THE ILLUSTRATED EMBODIMENTS

According to various embodiments of the invention, the periphery transistors of an access device may include conventional MOSFET type transistors while the access transistors are formed from RAD structures or FinFET structures. In other embodiments of the invention, the periphery transistors are fabricated before the access transistors are fabricated. In still other embodiments of the invention, the gates of the access transistors include a P-type workfunction material. Access transistors formed according to embodiments of the invention may be employed in integrated circuit devices.

According to certain embodiments of the invention, RAD structures or FinFET structures form the access transistor gates of an access device. In some embodiments, the gate material for the RAD structures or FinFET structures includes a P-type workfunction material or a P+ doped material. The P-type workfunction material or P+ doped material is preferred for the formation of RAD structures and FinFET structures. However, P-type workfunction material and P+ doped materials typically do not integrate well with N+ doped materials, such as the materials used to form conventional access device gate transistors. Therefore, other methods of fabricating access devices having RAD structures, FinFET structures, or a combination of RAD structures and FinFET structures as access gate transistors with P-type workfunction materials or P+ doping are desirable.

According to some embodiments of the invention, the periphery transistors of an access device may be formed prior to the formation of RAD structures or FinFET structures as access gate transistors. The access gate transistors may also be formed of a P-type workfunction material or a P+ doped material. A method for fabricating an access device according to embodiments of the invention is illustrated in FIGS. 1-18.

Figure 1:
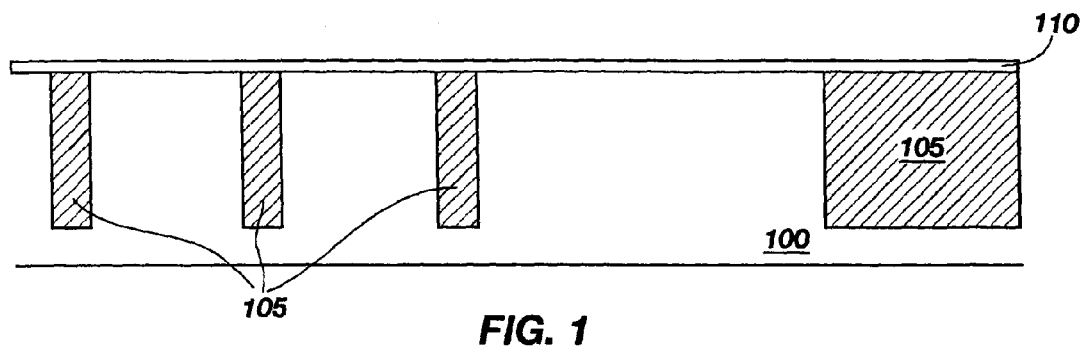
FIGS. 1-18 illustrate cross-sectional views of an access device during various acts in a fabrication process for fabricating an access device according to embodiments of the invention.

As illustrated in FIG. 1, a semiconductor substrate 100 or wafer is provided. The semiconductor substrate 100 may include silicon, silicon-on-insulator (SOI), silicon-on-sapphire (SOS), or other semiconductor compositions in wafer or other bulk substrate form. Field oxide regions 105 in the semiconductor substrate 100 may separate different channels in the access device. For example, the field oxide regions 105 may separate N-Channels and P-Channels in the semiconductor substrate 100. A gate oxide layer 110 overlies the semiconductor substrate 100 across an expanse of the semiconductor substrate 100.

Figure 2:
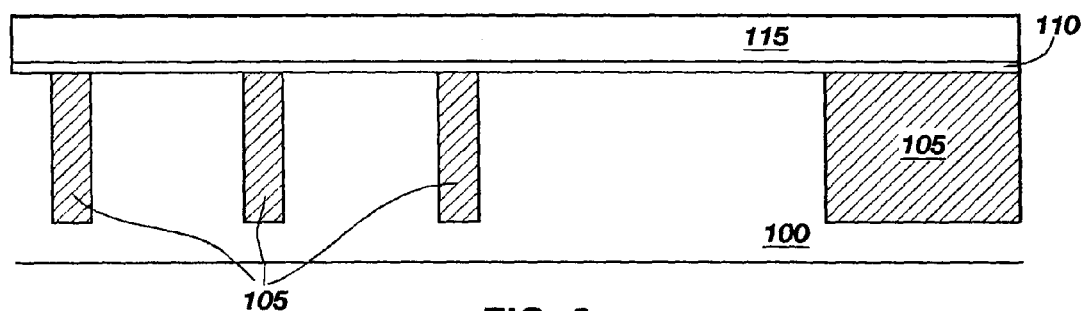

A first act in the fabrication of the periphery gate transistors involves the formation of the periphery gate transistor structures. As illustrated in FIG. 2, a polysilicon material 115 layer may be deposited over the gate oxide layer 110 on the semiconductor substrate 100. Deposition of the polysilicon material 115 layer over the semiconductor substrate 100 may be accomplished using physical vapor deposition (PVD) processes, chemical vapor deposition (CVD) processes, atomic layer deposition (ALD) processes, or other conventional deposition processes and, especially, deposition processes conventionally used in the formation of MOSFETs.

Figure 3:
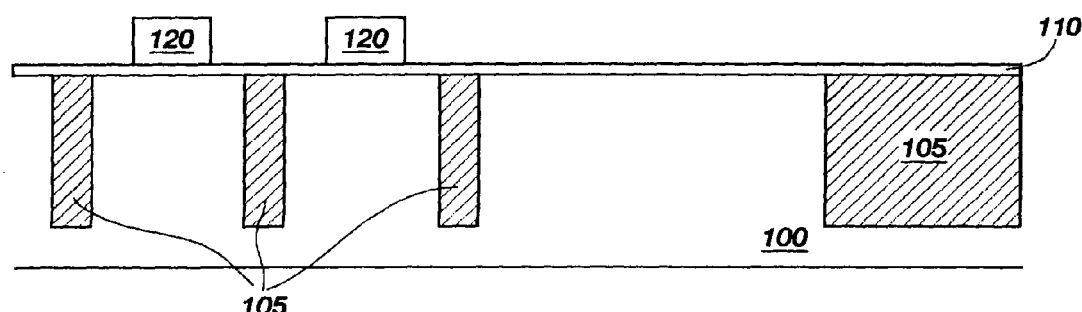

The polysilicon material 115 layer may be patterned and etched according to conventional methods to form gate electrodes 120 as illustrated in FIG. 3. The gate electrodes 120 are the gate electrodes for the periphery gate transistors of an access device. Patterning and etching of the polysilicon material 115 layer may be performed using conventional patterning and etching techniques used with MOSFET formation. For example, photolithographic patterning and etching processes may be used, as well as wet or dry etching processes.

Figure 4:
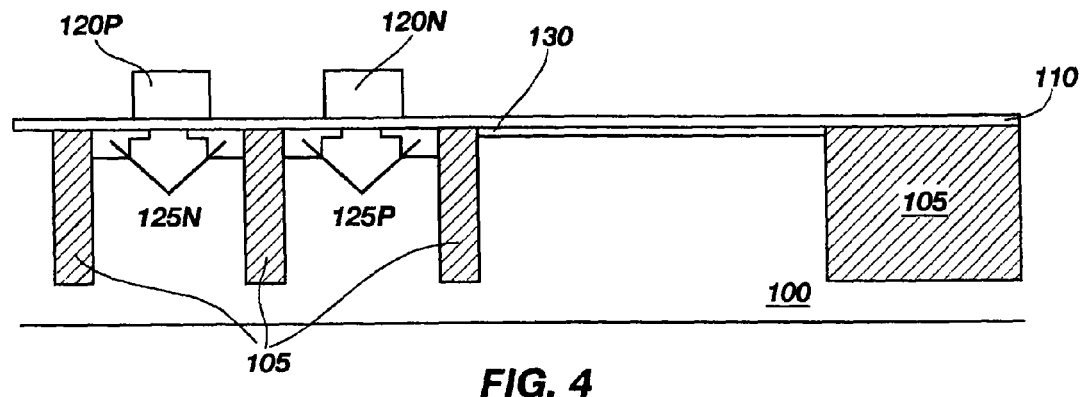

Following the formation of the gate electrodes 120, doping of the semiconductor substrate 100 and the gate electrodes 120 may be performed as illustrated in FIG. 4. Source and drain regions 125 may be doped with dopants to achieve a desired doping effect. The gate electrodes 120 may also be doped. For example, as illustrated in FIG. 4, one gate electrode 120N may be doped with N-type dopants while the source and drain regions 125P associated with, and spanned by, the gate electrode 120N may be doped with P-type dopants. Conversely, gate electrode 120P may be doped with P-type dopants while the associated source and drain regions 125N are doped with N-type dopants.

The semiconductor substrate 100 may also be doped in a region 130 where access gate transistors are to be formed in the semiconductor substrate 100. As illustrated in FIG. 4, the doped region 130 may be doped with an N-type dopant.

P-type dopants and N-type dopants that may be used to dope portions of the semiconductor substrate 100 include any conventional dopant that may be used in the formation of a MOSFET gate transistor. For example, P-type dopants may include boron or aluminum and N-type dopants may include phosphorus, arsenic, or antimony.

The doping illustrated in FIG. 4 is an example of the type of doping that may be carried out with particular embodiments of the invention. It is understood that other doping schemes may also be incorporated with embodiments of the present invention. For example, each of the gate electrodes 120N and 120P may be doped with N-type dopants and the corresponding source and drain regions 125 may be doped with P-type dopants. Other doping patterns are also within the scope of the invention and may vary depending upon the desired effect of the access device being fabricated.

Figure 5:
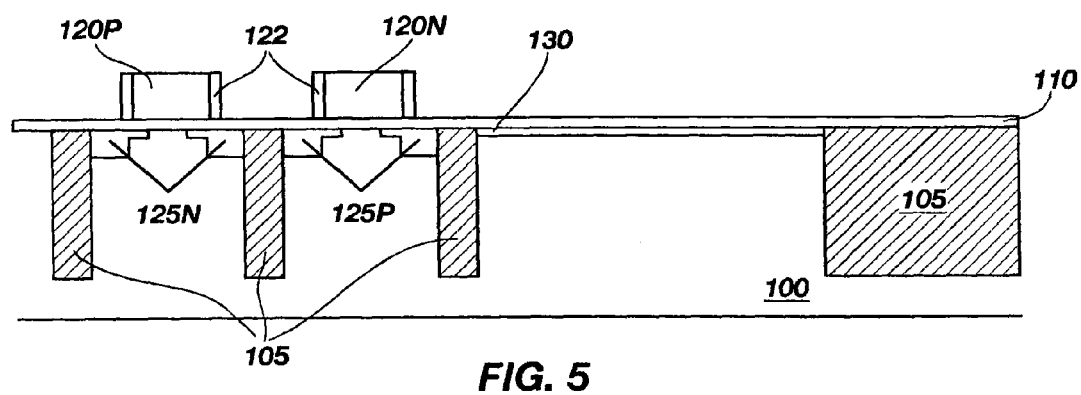

Following the doping of the semiconductor substrate 100 and gate electrodes 120, spacers 122 for the gate electrodes 120 are formed as illustrated in FIG. 5. The spacers 122 may be formed by depositing a spacer 122 material over the gate electrodes 120 and etching or otherwise patterning the spacer 122 material to form spacers 122. For example, nitride spacers 122 may be formed as illustrated in FIG. 5 according to conventional MOSFET fabrication processes.

Figure 6:
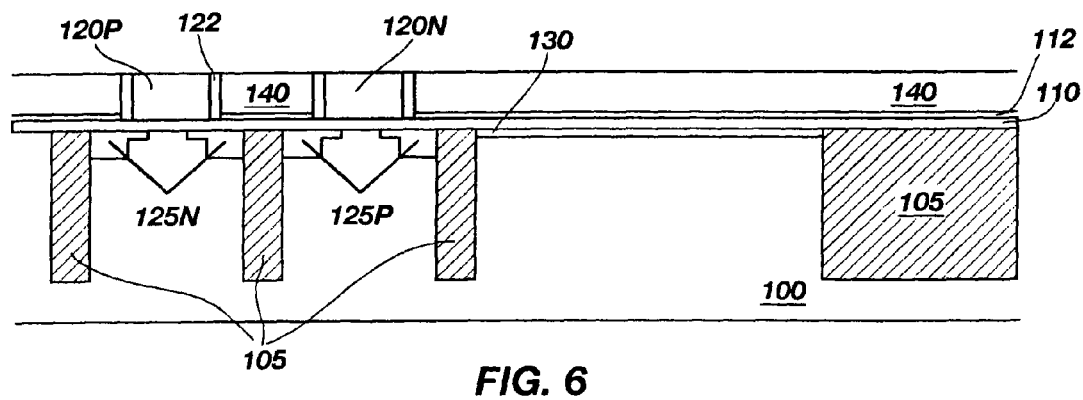

A nitride liner 112 may be formed over the gate oxide layer 110 on the semiconductor substrate 100 as illustrated in FIG. 6. A silicon substrate material 140 such as an insulating layer of borophosphosilicate glass (BPSG) may be formed over the nitride liner 112. Other materials used in access device fabrication methods may be used with, or in place of, the BPSG for the silicon substrate material 140. For example, the silicon substrate material 140 may include an insulating material. The partially fabricated access device 900 may be subjected to a thermal process to activate the dopants in the gate electrodes 120, source and drain regions 125, and in the doped region 130. If necessary, a chemical-mechanical planarization (CMP) of the substrate material 140 may be performed according to conventional CMP techniques.

Figure 7:
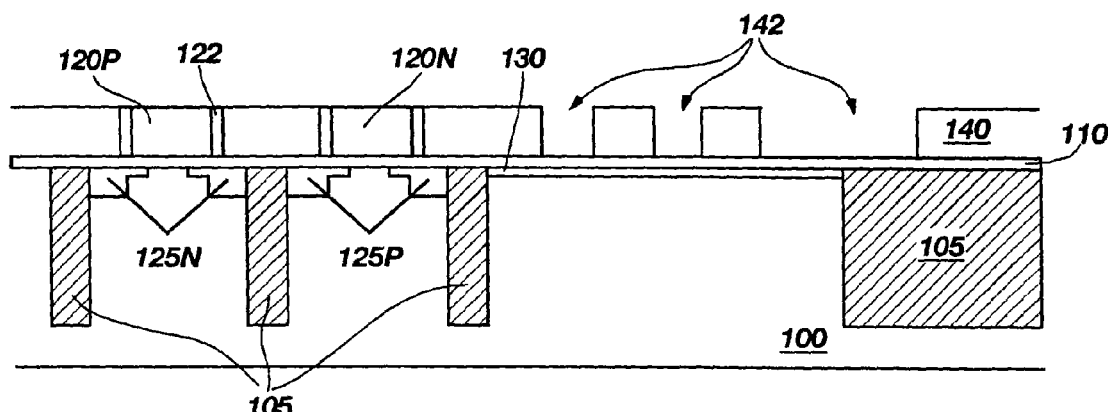

As illustrated in FIG. 7, the silicon substrate material 140 may be patterned and etched to form vias 142 through the silicon substrate material 140 to the nitride liner 112.

Figure 8:
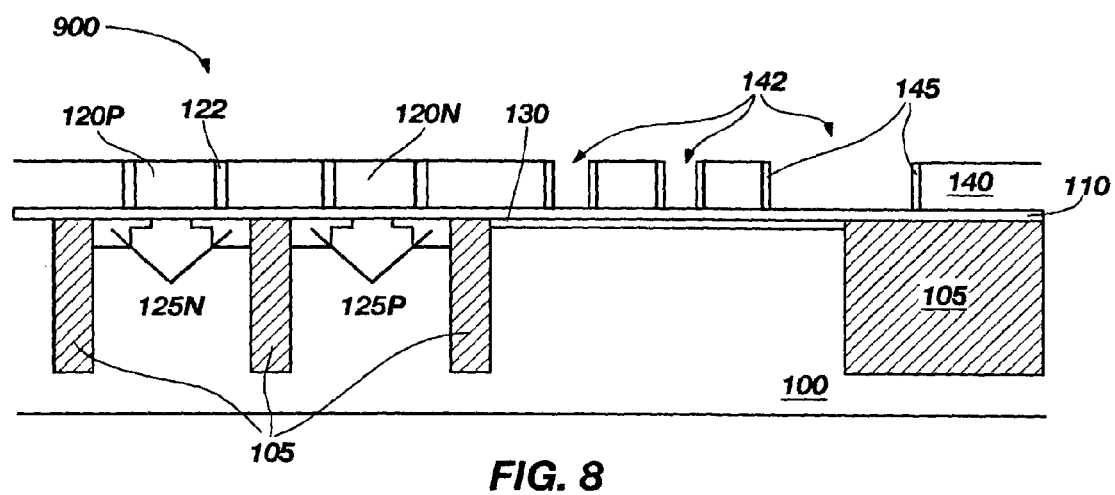

Access gate spacers 145 may be formed in the vias 142 as illustrated in FIG. 8. The access gate spacers 145 may be formed by depositing a layer of access gate spacer 145 material over the partially fabricated access device 900 and then etching or otherwise removing portions of the access gate spacer 145 material to leave the access gate spacers 145 in the vias 142. According to certain embodiments of the invention, the access gate spacers 145 may be formed of a nitride material.

Figure 9:
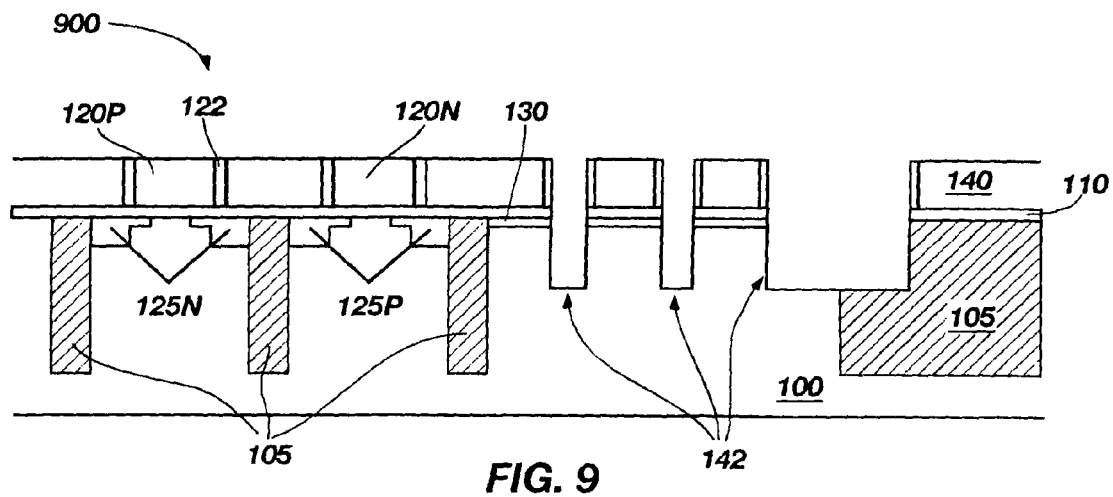

Trenches 144 in the semiconductor substrate 100 may be formed through vias 142 as illustrated in FIG. 9 to facilitate the formation of RAD structures, FinFET structures, or a combination of RAD structures and FinFET structures. The trenches 144 may be formed utilizing conventional etching processes. In some embodiments, the trenches 144 may be formed during etching of the access gate spacer 145 material. In other embodiments, the partially fabricated access device 900 may be masked and etched to form the trenches 144. In still other embodiments of the invention, Damascene processes may be used to form the trenches 144 in the semiconductor substrate 100 and to fill the trenches 144 with a conductive material.

Figure 10:
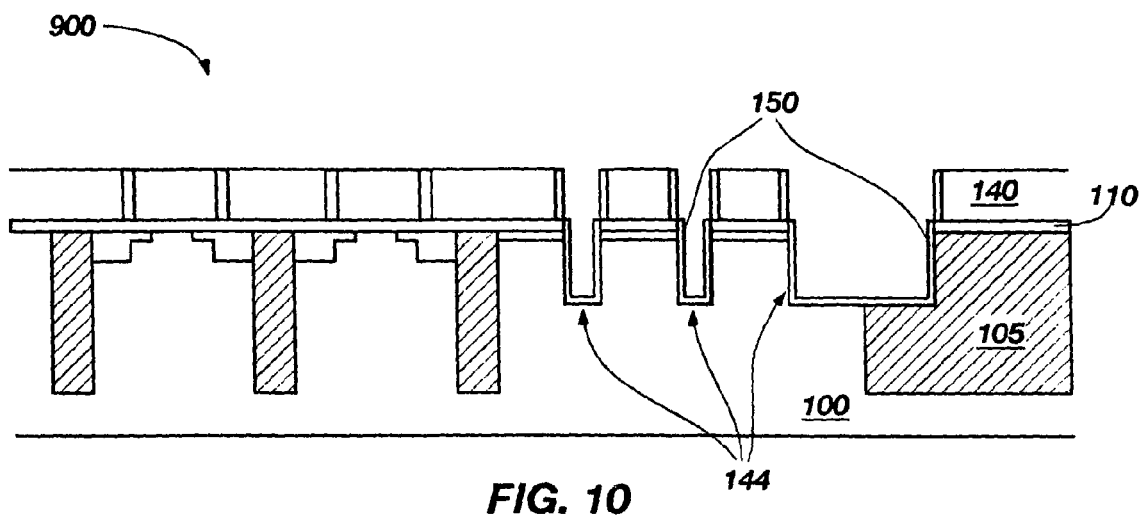

To prepare the trenches 144 for the formation of an access gate transistor structure therein, a gate oxide 150 layer may be grown or otherwise formed in the trenches 144 as illustrated in FIG. 10. Conventional methods for forming gate oxides in MOSFETs or other transistor devices may be used to form the gate oxide 150 layers in the trenches 144 of the partially fabricated semiconductor device 900.

Figure 11:
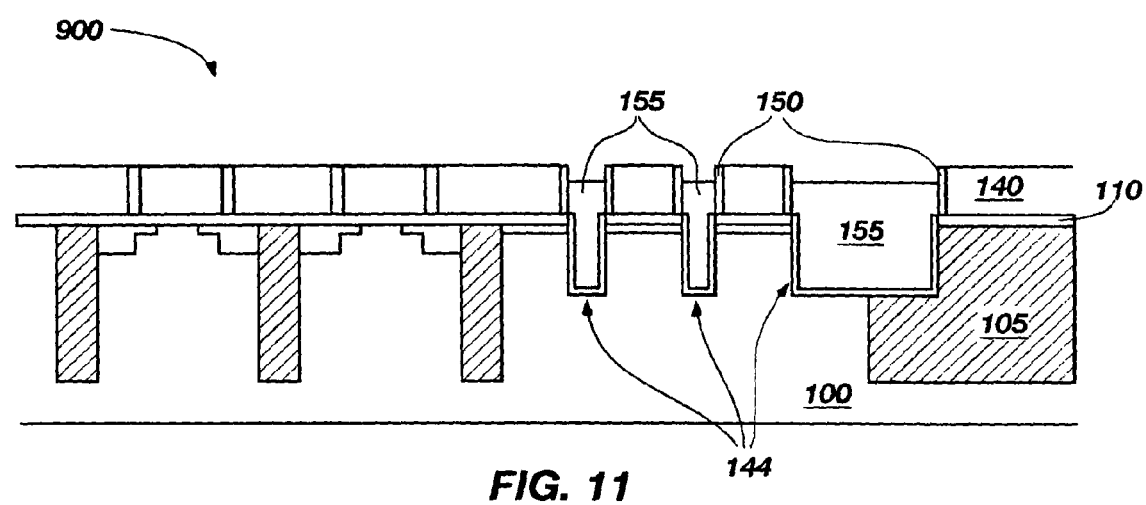

An access gate material may be deposited over the gate oxide 150 layers and then etched, resulting in the formation of the access gate electrode 155 as illustrated in FIG. 11. According to particular embodiments of the invention, the access gate material used to form the access gate electrode 155 has a P-type workfunction. The gate electrode 155 materials may include, but are not limited to, materials such as titanium nitride, ruthenium, ruthenium-oxide, or P-type workfunction materials. In other embodiments of the invention, the access gate electrode 155 may be formed of a material having a P-type doping.

Figure 12:
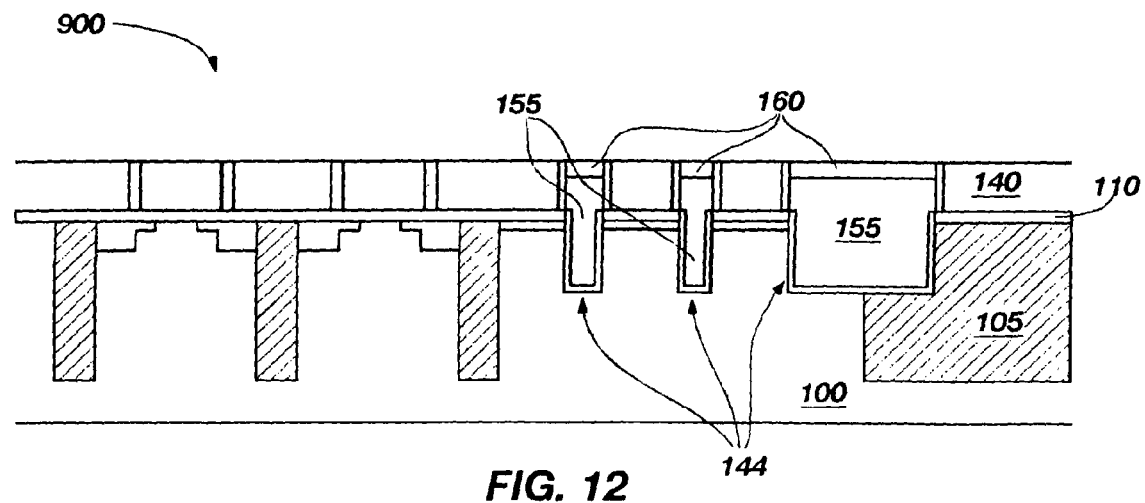

FIG. 12 illustrates the formation of cap 160 layer over the access gate electrodes 155. According to some embodiments of the invention, the cap 160 layer may be formed of a nitride. A cap 160 layer material may be deposited over the partially fabricated access device 900 and etched back to form the cap 160 layer. Conventional methods for depositing and forming a cap over a MOSFET transistor may be used with embodiments of the invention to form the cap 160 layer.

Figure 13:
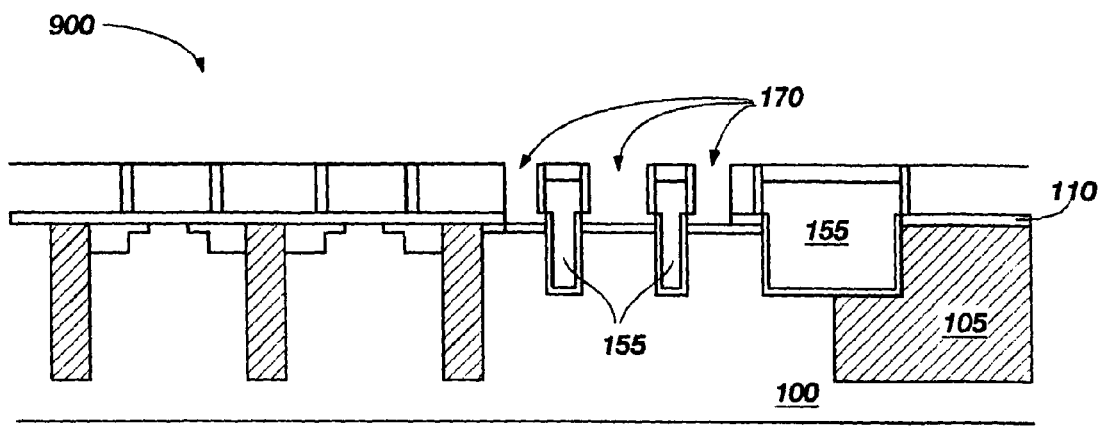
Figure 14:
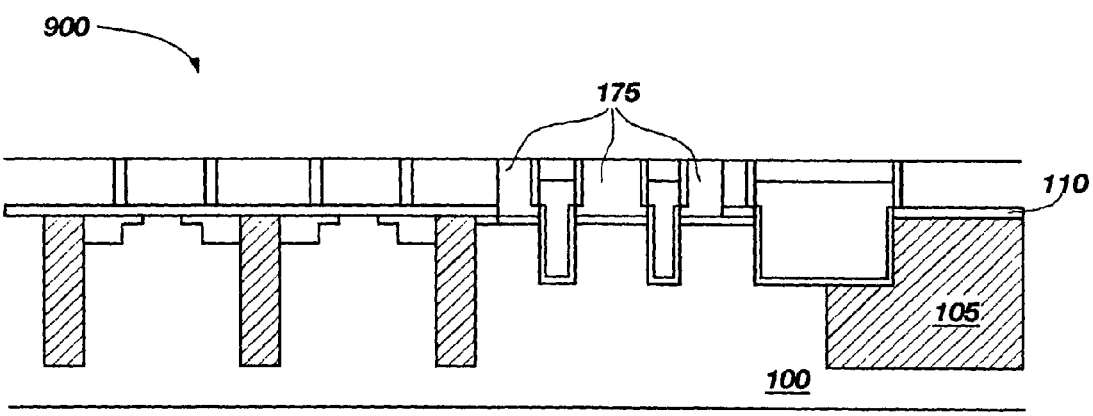

The partially fabricated access device 900 may be masked and etched to form openings 170 in the silicon substrate material 140 next to the access gate spacers 145 as illustrated in FIG. 13. A polysilicon layer may be deposited over the partially fabricated access device 900 and etch to form polysilicon plugs 175 in the openings 170 as illustrated in FIG. 14. Conventional methods for forming the openings 170 and for depositing polysilicon plugs 175 in the openings may be used according to embodiments of the invention.

Figure 15:
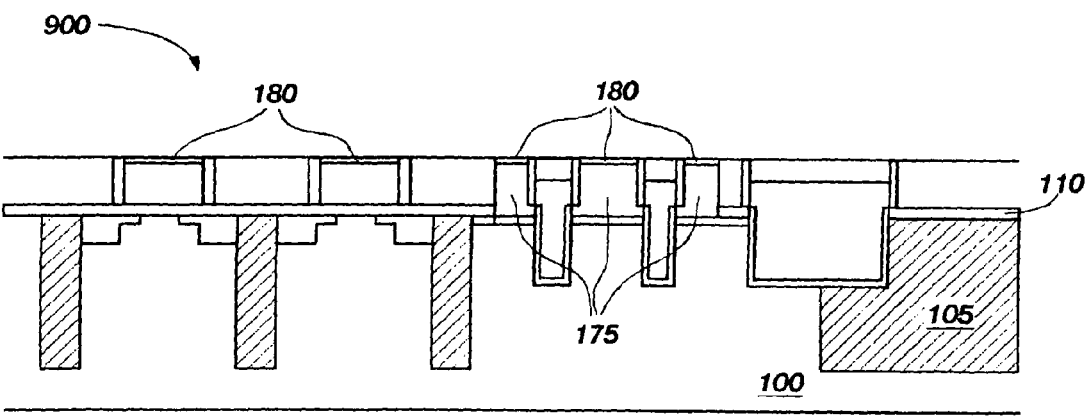

The formation of contact layers 180 over the polysilicon plugs 175 and gate electrodes 120 of the periphery gate transistors is illustrated in FIG. 15. In some embodiments of the invention, the contact layers 180 include a silicide material. Conventional methods for forming the contact layers 180 may be used according to embodiments of the invention.

Figure 16:
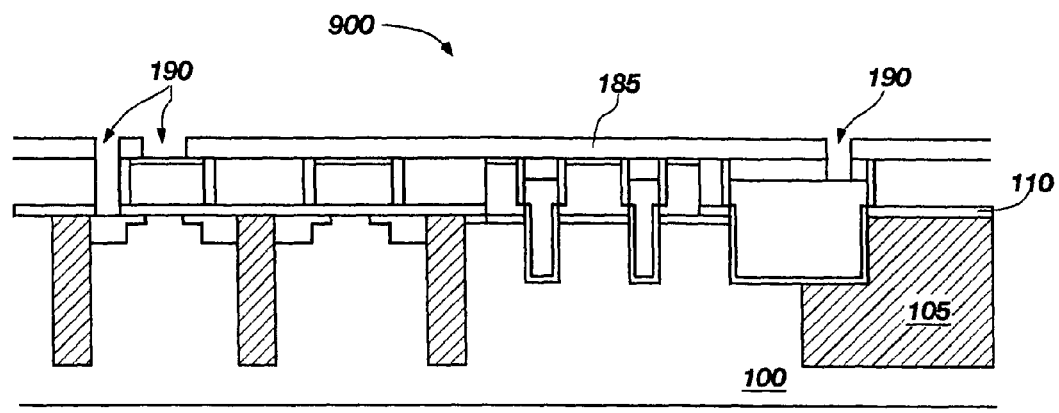

Further fabrication of the partially fabricated access device 900 may include the formation of a TEOS layer 185 over the partially fabricated access device 900 as illustrated in FIG. 16. Contact holes 190 in the partially fabricated access device 900 may be formed using conventional etch processes to allow access to source and drain regions 125, contact layers 180, and access gate electrodes 155 as illustrated in FIG. 16.

Figure 17:
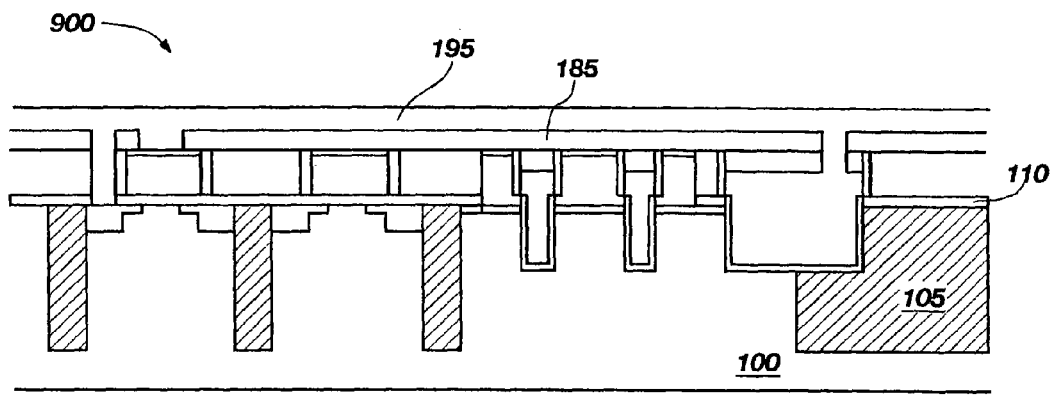

Contacts 195 for the access device may be formed on the partially fabricated access device 900 and in the contact holes 190 as illustrated in FIG. 17. The contacts 195 may include one or more layers of conductive material as conventionally used to form contacts 195 in access devices. According to some embodiments of the invention, the contacts 195 or contact layer may include titanium.

Figure 18:
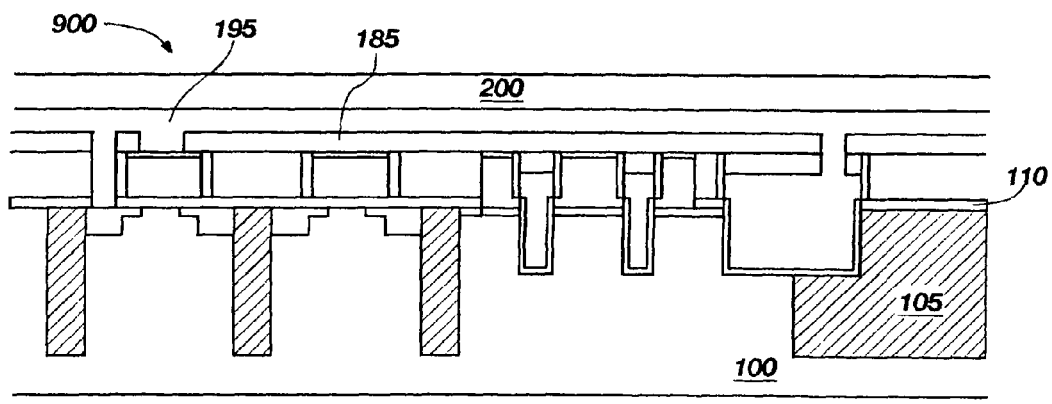

As illustrated in FIG. 18, further fabrication of the partially fabricated access device 900 may proceed according to conventional fabrication methods with the formation of a stack 200.

Access devices fabricated according to the process illustrated in FIGS. 1-18 may be used with various semiconductor devices as desired.

Figure 19:
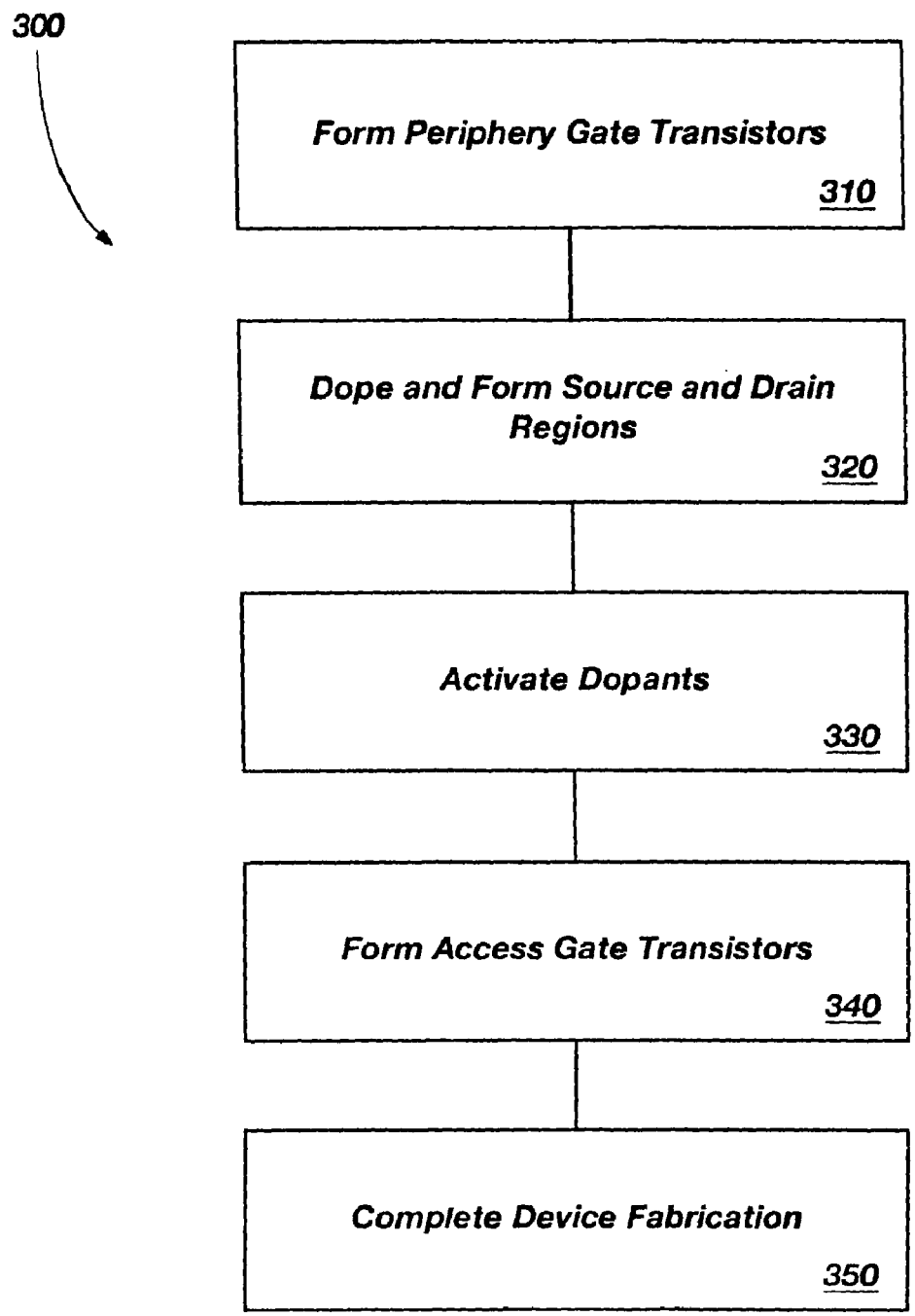
FIG. 19 illustrates a flow diagram of a fabrication process according to embodiments of the invention.

According to other embodiments of the invention, an access device having access gate transistors with P-type workfunctions may be fabricated utilizing RAD structures, FinFET structures, or a combination of RAD structures and FinFET structures at the access gate transistors. The access device with P-type workfunction access gate transistors may be fabricated according to the process flow 300 illustrated in FIG. 19.

In a first act 310 the periphery gate transistor structures are formed on a dielectric layer or semiconductor substrate. Dopants are then implanted in a second act 320. Dopants for the periphery gate electrodes and associated source and drain regions may be formed in the semiconductor substrate during the second act 320. In addition, in some embodiments, dopants are implanted in regions where the P-type workfunction access gate transistors are to be formed. The dopants are then activated in a third act 330.

The access gate transistor structures may then be formed in a fourth act 340. Formation of the access gate transistor structures includes the formation of trenches in the semiconductor substrate of the access device, formation of oxide layers in the trenches, and the deposition of P-type workfunction material in the trenches. In some instances, the P-type workfunction material may include a P-type doped material. The access gate transistor structures may be completed by forming caps over the P-type workfunction material and forming polysilicon plugs around the P-type access gate transistors.

The remainder of the fabrication of the access device may be completed in a fifth act 350, where conventional processes and fabrication methods are employed to complete the fabrication of the access device.

Figure 20:
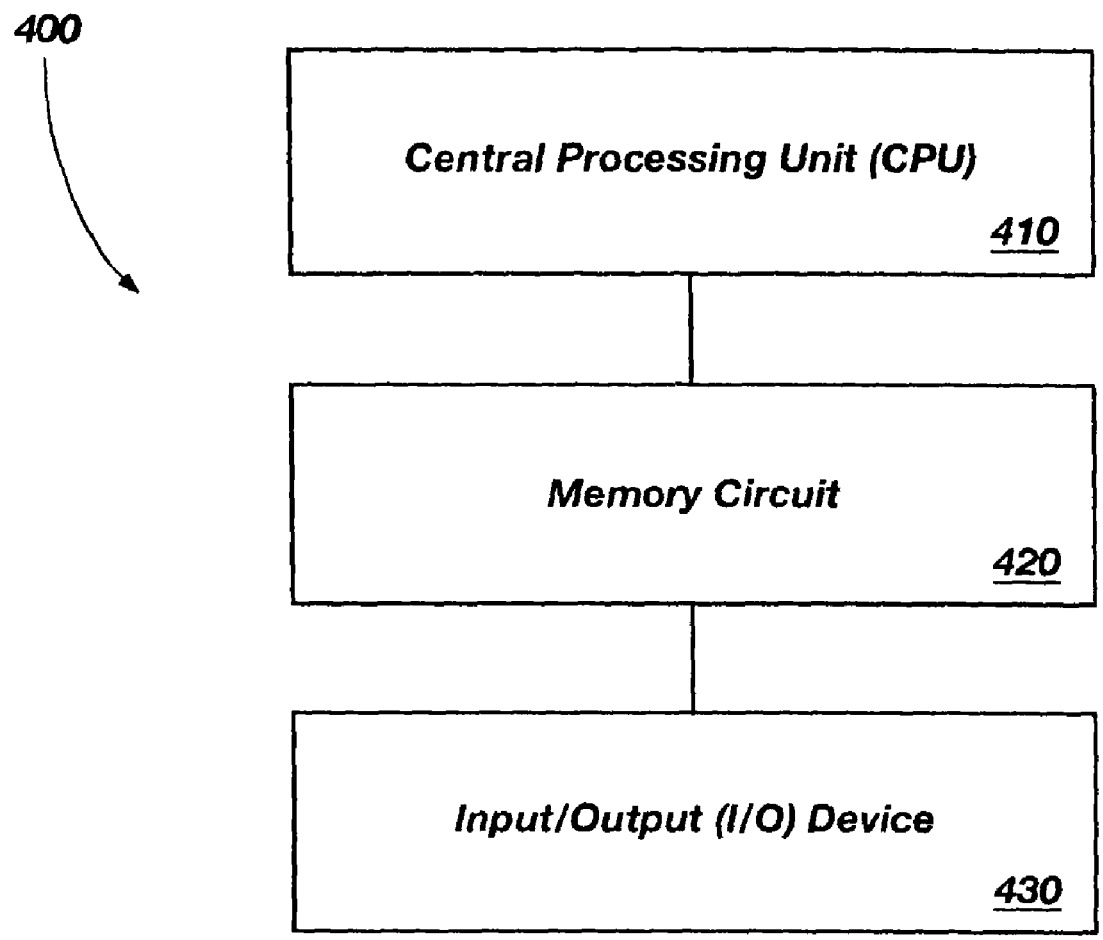
FIG. 20 illustrates a block diagram of a processor system incorporating access devices according to embodiments of the invention.

According to various embodiments of the invention, an access device having P-type workfunction materials in the access gate transistors, and particularly in access gate transistors formed from RAD structures or FinFET structures, may be packaged and used in a semiconductor device. For instance, a processor system (e.g., a computer system) incorporating one or more access devices according to embodiments of the invention is illustrated in FIG. 20. The processor system 400 may include a central processing unit (CPU) 410, a memory circuit 420, and an input/output (I/O) device 430. The memory circuit 420 may include an access device, such as a DRAM or other memory device, according to embodiments of the invention or fabricated in accordance with embodiments of the invention. The CPU 410 may also include semiconductor devices or access devices according to embodiments of the invention or fabricated in accordance with embodiments of the invention. The CPU 410 and memory circuit 420 may be integrated on a single chip or may be otherwise connected. Processor system 400 may comprise a personal computer, a server, a communications device (cell phone, personal digital assistant (PDA), etc.), a camera, or any other processor-based system.

Having thus described certain currently preferred embodiments of the present invention, it is understood that the invention defined by the appended claims is not to be limited by particular details set forth in the above description, as many apparent variations thereof are contemplated without departing from the spirit or scope thereof as hereinafter claimed.

What is claimed is:

1. A method comprising:
   forming at least two peripheral transistor gate structures within a peripheral circuitry region;
   forming at least two access transistor gate structures within an access circuitry region after forming the two peripheral transistors within the peripheral circuitry region, forming the peripheral transistor gate structures comprising depositing first gate oxide that extends over the access circuitry region, forming the access transistor gate structures comprising:
   depositing dielectric material over semiconductor material, the dielectric material being deposited over the first gate oxide;
   etching openings through the dielectric material to the first gate oxide;
   forming dielectric spacers on sidewalls of the openings;
   using the dielectric spacers and dielectric material as a mask, extending the openings through first gate oxide and into the semiconductive material by etching;
   forming a second gate oxide laterally over opposing sidewalls and over bases of the openings in the semiconductor material; and
   forming gate material within the openings in the dielectric material and the semiconductor material; and
   forming a polysilicon-comprising plug on individual of opposing lateral sides of the gate material of individual of the two access transistor gate structures, the polysilicon-comprising plugs extending laterally to beneath the dielectric spacers.

2. The method of claim 1 comprising forming a silicide contact onto individual of said polysilicon-comprising plugs and onto individual of the two peripheral gate structures, said silicide contacts being formed to have coplanar elevationally outermost surfaces.

3. The method of claim 1 comprising forming the respective polysilicon-comprising plugs to physically contact a lateral outermost side of at least one of the dielectric spacers.

4. The method of claim 1 comprising forming the respective polysilicon-comprising plugs to physically contact an elevationally innermost bottom surface of at least one of the dielectric spacers.

5. The method of claim 1 comprising forming the respective polysilicon-comprising plugs to physically contact a lateral outermost side of at least one of the dielectric spacers, and to physically contact an elevationally innermost bottom surface of at least one of the dielectric spacers.

\* \* \* \* \*

UNITED STATES PATENT AND TRADEMARK OFFICE
CERTIFICATE OF CORRECTION

PATENT NO. : 7,998,813 B2
APPLICATION NO. : 12/960862
DATED : August 16, 2011
INVENTOR(S) : Gordon A. Haller et al.

Page 1 of 1

It is certified that error appears in the above-identified patent and that said Letters Patent is hereby corrected as shown below:

On the face page, in field (54), in "Title", in column 1, line 4, after "OPPOSING" insert -- LATERAL --.

In column 1, line 4, after "OPPOSING" insert -- LATERAL --.

In column 1, line 6, below "Title" insert

-- RELATED PATENT DATA

This patent resulted from a continuation application of U.S. Patent Application Serial No. 11/521,329, filed September 13, 2006, entitled "Methods Of Fabricating An Access Transistor Having A Polysilicon-Comprising Plug On Each Of Opposing Lateral Sides Of P-type Workfunction Gate Material", naming Gordon A. Haller and Sanh D. Tang as inventors, the disclosure of which is incorporated by reference. --.

Signed and Sealed this
Twenty-fifth Day of October, 2011

David J. Kappos
*Director of the United States Patent and Trademark Office*